United States Patent Office 3,677,763
Patented July 18, 1972

3,677,763
PIGMENTED PHOTOSENSITIVE POLYMER SYSTEM

Charles D. De Boer and George W. Luckey, Rochester, N.Y., assignors to Eastman Kodak Company, Rochester, N.Y.

No Drawing. Filed Apr. 17, 1970, Ser. No. 29,663
Int. Cl. G03c *1/68*
U.S. Cl. 96—82 14 Claims

ABSTRACT OF THE DISCLOSURE

Photosensitive polymeric elements provide high relief images of good resolution when subjected to imagewise exposure to X-ray radiation and solvent development. Fluorescent pigments or phosphors which are dispersed in a light-sensitive polymer having unsaturated cyclic groups appended to the polymer backbone absorb the X-ray energy and transfer it to the polymer as actinic radiation thereby causing in-depth insolubilization of the polymer.

This invention relates to photographic production of images. In a particular aspect, this invention relates to the production of polymeric images and to photosensitive elements employed to prepare such images.

It is known in the photographic art to reproduce images by processes which involve imagewise exposure of a layer of a radiation-sensitive material to modify the physical characteristics of the material in areas of the layer which have been exposed. Among the radiation-sensitive materials which have been used in such processes are light-sensitive polymers which are insolubilized or hardened on exposure to actinic radiation. The resulting difference in physical properties between exposed and unexposed areas can be employed to prepare images by such procedures as application of mechanical pressure, application of heat, treatment with solvents, and the like. Thus, the layer can be treated with a solvent for the unhardened polymer, which is a non-solvent for the hardened polymer, thereby removing unhardened polymer and leaving an image of hardened polymer. Alternatively, the layer can be heated to a temperature which is between the tackifying point of the material in unexposed areas of the layer and material in exposed areas of the layer so that the lower melting material can be toned with a colored powder or transferred to a receiving surface. Such processes have been employed to prepare lithographic printing plates, stencils, photoresists, and similar photographic and photomechanical images. However, the image resolution obtainable with thick coatings of such polymers is often poor unless special care is taken to control the viscosity of the mixture. While for many applications the degree of resolution and image thickness obtainable with existing systems is satisfactory, for some applications it would be desirable to utilize light-sensitive polymer compositions capable of giving images of increased thickness and greater resolution.

It is an object of this invention to provide a novel photosensitive image-forming system.

It is a further object of this invention to provide novel photosensitive elements and compositions which can be employed to prepare relatively thick polymeric relief images having good image resolution.

It is another object of this invention to provide a process for preparing relatively thick polymeric relief images having high resolution using the novel photosensitive elements and compositions of the present invention.

These and other objects of this invention will become apparent to those skilled in the art from the further description of the invention which follows.

In accordance with the present invention a polymeric image is produced by providing a photosensitive composition comprising fluorescent pigment or phosphor dispersed in a lightsensitive polymer which has unsaturated cyclic groups appended to the polymer backbone and photosensitive elements comprising a support bearing a layer of the photosensitive composition. The photosensitive element is imagewise exposed to X-ray radiation to cause in-depth insolubilization of the polymeric layer in exposed areas and the layer can then be treated with a solvent to remove unexposed portions of the coating. Preferably, the pigment fluoresces in the ultraviolet region of the spectrum when irradiated with X-rays, but good results can be obtained by using combinations of pigments that fluoresce in the visible region of the spectrum if appropriate spectral sensitizers are included in the composition.

It is believed that when the pigment-containing polymeric coatings of the present invention are exposed to X-ray radiation, the X-rays penetrate throughout the depth of the coating and the X-ray energy apparently is absorbed by the fluorescent pigment or phosphor and transferred to the photosensitive polymer by virtue of the phosphor converting the X-rays to actinic radiation. The polymer is crosslinked and rendered insoluble throughout the depth of the exposed areas of the layer. Relatively thick polymeric layers thus can be employed to form high relief images of bound pigment without a loss of resolution, since X-rays are not only absorbed at the surface of the coatings to crosslink the polymer at the surface, but penetrate the coating and become absorbed throughout the layer, thereby forming insoluble, crosslinked polymeric material in depth.

Any suitable fluorescent pigment can be employed in the practice of the present invention. Thus, there can be employed any pigment which absorbs the X-ray radiation upon imagewise exposure and re-emits it at a wavelength to which the polymer or sensitized polymer composition is sensitive, i.e., a wavelength which is absorbed by the polymer and causes it to become insoluble. Particularly effective are heavy metal phosphors such as activated barium sulfates, e.g. lead-activated barium sulfate, lanthanide-activated barium sulfates such as gadolinium-activated barium sulfate, europium activated barium sulfate, lead-activated silicates such as lead-activated barium silicate, lead-activated strontium sulfate, europium activated barium strontium sulfate, cerium-activated sulfates and fluorides, activated calcium fluorides, barium fluoride, barium fluoride chloride, gadolinium-activated yttrium oxide, zinc oxide, mixtures thereof, and the like. Particularly preferred are the fluorescent barium sulfate pigments. These phosphors can be prepared by a number of ways, such as set forth in Belgian Pat. 703,998 issued Mar. 18, 1968, to Luckey, in Buchanan et al., J. Applied Physics, vol. 39, pp. 4342–4347 (1968) and in Clapp and Ginther, J. of the Optical Soc. of America, vol. 37, No. 1, pp. 355–362 (1947). While it is most desirable in practicing this invention that the fluorescent pigment emit substantially in the ultraviolet electromagnetic spectral range, satisfactory results are achieved with phosphors which have their relative energy of emission peak in the near ultraviolet, blue or green regions, that is, about to 550 nm., if, as indicated above, a spectral sensitizer is employed. Barium lead sulfate is such as example since it emits in both the blue and ultraviolet regions but peaks in the near ultraviolet, i.e. at about 340–370 nm.

The phosphor is in a finely divided form and may suitably have a particle size in the range of between about 0.1 micron and about 100 microns, preferably between about 5 microns and about 20 microns. Suitable concentrations of phosphor include between about 5 grams and about 100 grams of phosphor per gram of polymer, preferably between about 8 grams and about 12 grams.

The photosensitive polymeric matrix for the fluorescent pigment that is employed in the photoelements of the present invention can be prepared from many suitable light-sensitive polymers. A preferred class of light-sensitive polymers may be characterized as having unsaturated cyclic groups appended to the polymer backbone. The unsaturated cyclic group is a three to six membered carbocyclic or monocyclic ring containing an ethylenic double bond, or is a five to six membered unsaturated heterocyclic ring fused to an aromatic ring of the benzene series. The heterocyclic ring can contain such non-metallic hetero atoms as oxygen, sulfur, nitrogen and the like. The light-sensitive polymers may be prepared by condensing a carboxylic acid derivative of the unsaturated cyclic group with a preformed polymer backbone containing groups reactive therewith, such as hydroxyl groups and amino groups. Thus, the unsaturated cyclic group can be joined to the polymer backbone through a carbonyl group, for example, through a carbonyloxy linkage, an oxycarbonyl linkage or an amido linkage.

The cyclic group which are contained in the light-sensitive polymers employed in the present invention include derivatives of such unsaturated three to six membered carbocyclic compounds as aryl and diarylcyclopropenes, alkyl and dialkylcyclopropenes, aryl and diarylcyclobutenes, alkyl and dialkylcyclobutenes, aryl and diarylcyclopentenes, alkyl and dialkylcyclopentenes, aryl and diarylcyclohexenes, alkyl and dialkylcyclohexenes, etc., and such unsaturated five to six membered heterocyclic compounds containing a fused aromatic ring as benzofurans, benzo-thiofurans, benzopyrans, coumarins, indoles and the like.

The polymers which form the backbone of the light-sensitive polymers and to which the light-sensitive moieties are appended include natural and synthetic resins such as free hydroxyl containing polymers, for example, polyvinyl alcohol, polyvinyl alcohol-co-vinyl acetate, polyvinyl alcohol-co-vinyl benzoate, polyvinyl alcohol-co-vinyl acetate-co-vinyl benzoate, polyethers such as epoxy and phenoxy polymers, e.g., the condensation product of diphenylolpropane with epichlorochydrin, thermoplastic phenolic resins such as novolac resins, e.g., phenol formaldehyde and cresol formaldehyde novolac resins; naturally occurring material such as cellulose, starch, guar, alginic acid, and their partially esterified or etherified derivatives, polyesters of polyhydroxy intermediates such as glycerol and sorbitol which have free hydroxyl groups remaining after incorporation in the polymer chain; polymers containing reactive amino groups such as aminostyrene, and anthranilic acid polymers such as polyvinyl anthranilate.

The light-sensitive polymers utilized in the present invention have repeating units which can be depicted by one of the following structural formulae:

I

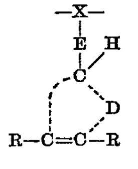

II

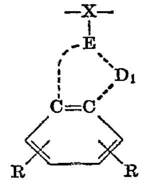

wherein X represents a polymer backbone; E is a linkage such as a carbonyloxy linkage, an oxycarbonyl linkage, an amido linkage, and the like; D represents the non-metallic atoms necessary to complete a three to six membered carbocyclic or monocyclic heterocyclic ring, preferably D represents the atoms necessary to complete a carbocyclic ring such as a cyclopropene ring, a cyclobutene ring, a cyclopentene ring or a cyclohexene ring; $D_1$ represents the non-metallic atoms necessary to complete a five to six membered unsaturated heterocyclic ring such as a furan ring, a thiofuran ring, a pyrrole ring, a pyran ring, a pyrone ring, etc.; and each R is a hydrogen atom, an alkyl group of 1 to 12 carbon atoms (e.g., methyl, ethyl, propyl, butyl, amyl, hexyl, monyl, decyl, dodecyl, etc.), or an aryl group having one or two rings, such as a phenyl or a naphthyl group which is unsubstituted or substituted with one or more of such groups as hydroxy groups, halogen groups (e.g., chloro and bromo groups), carbonyl groups, cyano groups, alkyl groups of 1 to 12 carbon atoms, alkoxy groups of 1 to 12 carbon atoms, and the like.

A particularly preferred group of light-sensitive polymers are those which are obtained by esterifying a hydroxyl containing polymer with 1,2-diarylcyclopropene-3-carbonyl chloride and which contain repeating units represented by the following structural formula:

III

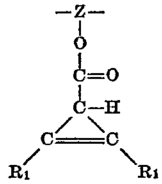

wherein Z represents the polymeric residue of a hydroxyl containing polymer; and each $R_1$ is an aryl group such as a phenyl group, a substituted phenyl group, a naphthyl group, a substituted naphthyl group, etc.

In addition to the light-sensitive group, the polymers employed in this invention may contain other non-light sensitive groups attached to the polymer backbone. Such other groups are often useful in modifying such physical properties of the polymer as solubility, adhesivity, melting point, and the like. Useful groups include those derived from aliphatic and aromatic carboxylic acids, such as acetic acid, haloacetic acids, propionic acid, succinic acid, glutaric acid, adipc acid, sebacic acid, decanoic acid, benzoic acid, halobenzoic acids, nitrobenzoic acids, toluic acids, p-ethylbenzoic acid, p-octylbenzoic acid, p-ethoxybenzoic acid, p-amyloxybenzoic acid, 2-naphthoic acid, and the like. These groups can comprise up to 90 mole percent of the groups attached to the polymer backbone. Thus, polymers may contain as little as 10 mole percent of the light-sensitive group attached to the polymer backbone and preferably contain about from 10 to 85 mole percent of the light-sensitive group.

These additional modifying groups may be represented by repeating units having the structural formula:

IV

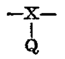

and in particular by the structural formula:

V

wherein X and Z are as defined above and Q represents the residue of an aliphatic or aromatic carboxylic acid, referred to above, when reacted with a hydroxyl or amino containing polymer.

The polymers may be prepared by reacting a polymer containing a free hydroxyl or amine group with a carboxylic acid chloride of an appropriate light-sensitive unsaturated cyclic compound. A highly useful procedure for preparing light-sensitive polymers which have good solubility and other desirable physical properties is described in copending Reynolds U.S. application Ser. No. 812,380, entitled "A Process for the Preparation of Soluble Polyvinyl Esters" filed Apr. 1, 1969. This procedure involves swelling a hydroxyl containing polymer in pyridine followed by partial esterification with an aroyl chloride such as benzoyl chloride. The light-sensitive acid chloride is then reacted with the mixture and finally the esterification of any remaining hydroxyl groups is completed with benzoyl chloride. Acetone or dimethylformamide is then added, insoluble materials are filtered off and the polymer is precipitated by drawing the solution through a water aspirator. The polymer is then leached in running water and air dried.

The light-sensitive acid chlorides used to prepare polymers employed in the present invention may be prepared by procedures known to those skilled in the art. For example, 1,2-diphenylcyclo-propene-3-carboxylic acid can be prepared by the procedure of Breslow et al., J. Org. Chem., vol. 24 (1959), page 415, which involves the dropwise addition of ethyldiazoacetate to a stirred melt of diphenylacetylene at 130° C. containing 1–2% copper dust, followed by basic hydrolysis of the reaction mixture, extraction of the unreacted diphenylacetylene with cyclohexane and acidification to precipitate the product.

Similarly, 5,6-benzopyran-3-carboxylic acid can be prepared by the procedure of Taylor et al., J. Chem. Soc., (1950), page 2724, which involves slowly adding a solution of sodium hydroxide to a refluxing mixture of salicylaldehyde, acrylonitrile and water, cooling the mixture to precipitate the nitrile which is then hydrolyzed with refluxing sodium hydroxide to give the carboxylic acid. The light-sensitive carbonyl chlorides may be prepared by reacting the corresponding carboxylic acid with a halogenating agent such as thionyl chloride or oxalyl chloride.

The polymers employed in the coating compositions of the present invention form the subject matter of U.S. patent application Ser. No. 831,242, filed June 6, 1969 in the name of Charles D. De Boer.

The present coating compositions may be sensitized with such materials, for example, as pyrylium and thiapyrylium salts (e.g. 2,6-bis(p-ethoxyphenyl)-4-(p-amyloxyphenyl) thiapyrylium perchlorate), thiazoles, benzothiazolines, naphthothiazolines (e.g., 2-benzoylmethylene-1-methyl-β-naphthothiazoline), quinolizone, Michler's ketone, Michler's thioketone, benzophenone, furanones, anthraquinones, 2,6-bis-p-azidobenzal-4-methylcyclohexanone and the like sensitizers. Suitable concentration of the sensitizer include between about 0.005 and about 5 weight percent of the polymer.

The coating compositions of this invention may be prepared by dispersing or dissolving the polymer and the fluorescent pigment in finely divided form in a suitable organic solvent such as aromatic solvents, for example, benzene, xylene, toluene, benzyl alcohol, etc.; alkanols, such as ethanol, isopropanol, 2-methoxyethanol, etc.; ketones such as acetone, 2-butanone, 4-methyl-2-pentanone, cyclohexanone, etc.; chlorinated hydrocarbon solvents such as chloroform, carbon tetrachloride, trichloroethylene, dichloroethane, trichloroethane, tetrachloroethane, etc.; dimethyl formamide; mixtures of these solvents, and the like. A preferred solvent is dichloroethane.

The coating compositions may include a variety of photographic addenda utilized for their known purpose, such as agents to modify the flexibility of the coating, agents to modify its surface characteristics, agents to modify the adhesivity of the coating to the support, and a variety of other addenda known to those skilled in the art.

The light-sensitive polymer may be the sole polymeric constituent of the coating composition or another polymer can be incorporated therein to modify the physical properties of the composition and serve as a diluent. For example, phenolic resins such as thermoplastic novolac resins may be incorporated in the composition to improve the resistance of the polymer composition to etchants when it is used as a photoresist. Similarly, hydrophilic polymers such as cellulose and its derivatives, polyalkylene oxides, polyvinyl alcohol and its derivatives, etc., may be incorporated in the composition to improve the hydrophilic properties of the coating when it is used in the preparation of lithographic printing plates. These other polymeric materials can constitute up to 25% by weight, based on the weight of the light-sensitive polymer, of the coating composition.

The present photosensitive elements may be prepared by coating pigmented compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyalkyl methacrylates [e.g., poly(methylmethacrylate)], polyester film base [e.g., poly(ethylene terephthalate)], polyvinyl acetals, polyamides (e.g., nylon), cellulose ester film base (e.g., cellulose nitrate; cellulose acetate, cellulose acetate propinates, cellulose acetate butyrate), and the like.

The optimum coating thickness for a particular purpose will depend upon such factors as the use to which the coating will be put, the particular polymer employed, and the nature of other components which may be present in the coating. However, as previously mentioned, the present system which employs penetrating X-rays as the source of exposing radiation permits the utilization of relatively thick layers. Thus, suitable coating thicknesses include, for example, between about 0.1 and about 10 mils, preferably between about 1 and about 7 mils.

As previously mentioned, polymeric images may be prepared employing the present coatings by imagewise exposure of the present photoelements to X-ray radiation to harden or insolubilize the polymer and thereby bind the pigment in exposed areas. Any conventional source of X-ray radiation may be employed. The intensity of the X-ray radiation and exposure time will depend upon the particular polymer, pigment and sensitizer, if any, employed. For example, the present coatings may be subjected to between about 40 and about 75 kv. at between about 15 and about 50 ma. at a distance of between about 4 and about 12 inches for a period of between about 1 and about 60 minutes.

The exposed photoelements of the present invention may be developed with a solvent for the unexposed, uncrosslinked polymer which is a non-solvent for the exposed hardened polymer. Suitable solvents include those mentioned above as suitable solvents employed in the preparation of coatings. A preferred solvent for this purpose is dichloroethane.

Photosensitive elements prepared in accordance with the present invention find utility in various photographic applications, such as in the preparation of photomechanical images such as lithographic printing plates, photoresists, and the like. However, the photoelements of the present invention are particularly useful in applying dots of phosphor in an oriented pattern for use in cathode ray tubes or in radiographic screens. In such application, any sensitizer employed is removed by washing or other treatment to obtain improved optical characteristics.

The following examples further illustrate the present invention. The percentages are by weight, unless otherwise specified.

EXAMPLE 1

The example illustrates the preparation of a light-sensitive polymer which can be used in the photosensitive elements of the present invention.

One and one-third grams of a medium molecular weight polyvinyl alcohol containing 12 percent acetate groups (Elvanol 52–22 sold by E. I. du Pont Company) are swollen in 20 milliliters of dry pyridine at 90° C. for one hour. Next, 0.5 milliliter of benzoyl chloride is added with stirring, and the mixture is stirred for one hour.

Under safelight conditions, 1.0 gram of 1,2-diphenylcyclopropene-3-carboxylic acid chloride is added with stirring and the mixture is stirred in the dark for one hour. Once the light-sensitive acid chloride is added, all operations are performed under safelight conditions or in the dark. At the end of this time, the solution is homogeneous, clear, transparent and viscous. Next, 0.8 milliliter of benzoyl chloride is added, the mixture is stirred for one hour and then held at 50° C. for one hour without stirring. After this, 15 milliliters of acetonitrile are added and the polymer is precipitated into 1500 milliliters of water with stirring. The polymer is collected and pressed dry. It is then dried in a vacuum oven at 60° C. and $10^{-1}$ torr pressure for one hour. The polymer is dissolved in 100 milliliters of acetone, precipitated into one liter of water, collected and dried in a vacuum oven for 12 hours at 50° C. and a pressure of 11 torr. The product obtained is a white, friable, light-sensitive polymer containing 26 mole percent 1,2-diphenylcyclopropene-3-carboxylate groups.

EXAMPLE 2

The following example illustrates the preparation of photosensitive element of the present invention.

A slurry is prepared by mixing 4 grams of lead activated barium sulfate pigment particles with 2 milliliters of a solution of the polymer prepared in the manner of Example 1, viz, a photo-sensitive polymer containing the 1,2-diphenylcyclopropene-3-carboxylate group. This solution contains 500 mg. of the polymer in 10 milliliters of dichloroethane and one hundred milligrams of 2-benzoylmethylene-1-methyl-β-naphthothiazoline as sensitizer. The slurry is coated at a thickness of 15 to 25 mils onto sheets of aluminum having a thickness of 0.005 inch, and is permitted to dry. Also prepared in exactly the same way is a photosensitive element using gadolinium activated barium sulfate.

EXAMPLE 3

The following example illustrates the employment of the present photoelements in the process of the invention.

The plates of Example 2 are exposed through the aluminum support to a dot pattern of 50 kv. X-rays at 10 ma. current at a distance of three inches from the source for 1, 2, 4 and 8 minutes. Next, the plates are developed by immersion in dichloroethane for three minutes. A pattern of dots is produced with the one-minute exposure of the barium lead sulfate element, while 2-minute exposure is required to form the pattern with barium gadolinium sulfate. Each dot is at least 0.5 millimeter in depth and has sharp sides and good resolution.

EXAMPLE 4

Five grams of lead-activated barium sulfate are mixed with 9.4 ml. of a solution of five grams of poly(vinyl alcohol-co-vinyl benzoate-co-vinyl diphenylcyclopropene carboxylate), with 50 mg. of 2-benzoylmethylene-1-methyl-β-naphthothiazoline sensitizer in 100 ml. of 50:50 dichloroethane 2-methoxyethanol. The slurry is well mixed, poured onto 5 mil grained aluminum support and allowed to air dry for 3 to 5 hours under yellow lights. A coating having a dry thickness of 7 mils is obtained and it is then exposed to X-radiation (60 kv., 30 ma. for 15 minutes at a distance of 2 inches) through a mask. This mask is made from lead alloy plate 25 mils thick perforated with 200 micron holes, drilled with a 50 micron spacing between them. The exposed coating is then immersed in an ultrasonically agitated acetone bath until the unexposed area around the dot pattern is clean and some of the pigment between the exposed dots begins to be removed. This takes about 5 minutes. The material is allowed to dry for an hour or more and then subjected to gentle sandblasting with an "Airbrasive" sandblaster sold by S. S. White, Inc. at an air pressure of 20 lbs./inch$^2$ and a mixing chamber voltage of 30 v. The abrasive is finely powdered dolomite (calcium magnesium carbonate). This removes the remaining pigment between the exposed areas of the dot pattern. The resulting "dots" are 200 microns high, 200 microns in diameter and have spaces of 50 microns between the dots. The tops of the dots are slightly rounded from the sandblast, but there is no sign of the undercut commonly observed in etch processes.

When this example is repeated, substituting for the lead activated barium sulfate phosphor, europium activated barium sulfate, activated calcium fluoride, barium fluoride, zinc oxide or lead-activated strontium sulfate phosphors, similar results are obtained.

The invention has been described in detail with particular references to preferred embodiments thereof, but it will be understood that variations and modifications can be effected within the spirit and scope of the invention.

What is claimed is:

1. A photosensitive coating composition comprising a light-sensitive polymer having appended to the polymer backbone unsaturated cyclic groups which are non-aromatic three to six membered carbocyclic rings containing an ethylenic double bond and dispersed in the polymer a fluorescent pigment which absorbs X-ray radiation and reemits it at a wavelength to which the light-sensitive polymer is sensitive.

2. The coating composition of claim 1 wherein the unsaturated cyclic groups are three membered carbocyclic rings containing an ethylenic double bond.

3. The coating composition of claim 1 wherein the pigment is a heavy metal phosphor selected from the group consisting of gadolinium activated barium sulfate, lead-activated barium sulfate, europium-activated barium sulfate, activated calcium fluoride, barium fluoride, zinc oxide and lead-activated strontium sulfate.

4. The coating composition of claim 3 wherein the fluorescent pigment is an activated barium sulfate pigment.

5. The coating composition of claim 4 wherein the light-sensitive polymer is poly(vinyl diarylcyclopropene carboxylate).

6. The coating composition of claim 4 wherein the light-sensitive polymer is poly(vinyl-1,2-diphenylcyclopropene-3-carboxylate).

7. A photosensitive coating composition comprising an activated barium sulfate phosphor dispersed in a light-sensitive poly(vinyl alcohol-co-vinyl benzoate-co-vinyl diphenyl-cyclopropene carboxylate)polymer.

8. The coating composition of claim 7 wherein the composition contains 8 to 12 parts of the phosphor per part of polymer.

9. A photosensitive element which comprises a support bearing a layer of a photosensitive composition comprising a light-sensitive polymer having appended to the polymer backbone unsaturated cyclic groups which are non-aromatic three to six membered carbocyclic rings containing an ethylenic double bond and dispersed in the polymer a fluorescent pigment which absorbs X-ray radiation and reemits it at a wave-length to which the light-sensitive polymer is sensitive.

10. The photosensitive element of claim 9 wherein the unsaturated cyclic groups are three membered carbocyclic rings containing an ethylenic double bond.

11. The photosensitive element of claim 9 wherein the heavy metal phosphor is selected from the group consisting of gadolinium-activated barium sulfate, lead-activated barium sulfate, europium activated barium sulfate, activated calcium fluoride, barium fluoride, zinc oxide and lead-activated strontium sulfate.

12. The photosensitive element of claim 9 wherein the phosphor is lead-acitvated barium sulfate and the light-sensitive polymer is a poly(vinyl diarylcyclopropene carboxylate).

13. The photosensitive element of claim 12 wherein the support is aluminum.

14. The photosensitive element of claim 12 wherein the support is glass.

References Cited

UNITED STATES PATENTS

| | | | |
|---|---|---|---|
| 2,811,443 | 10/1957 | Robertson et al. | 96—115 X |
| 2,747,997 | 5/1956 | Smith, et al. | 96—115 |
| 3,255,006 | 6/1966 | Bailey | 96—115 X |
| 3,300,311 | 1/1967 | Kennard et al. | 96—82 |

RONALD H. SMITH, Primary Examiner

U.S. Cl. X.R.

96—35.1, 86 P, 115 R